(12) United States Patent
Lee et al.

(10) Patent No.: US 12,224,759 B2
(45) Date of Patent: Feb. 11, 2025

(54) APPARATUS AND METHOD FOR CALIBRATING MISMATCHES OF TIME-INTERLEAVED ANALOG-TO-DIGITAL CONVERTER

(71) Applicant: SAMSUNG ELECTRONICS CO., LTD., Suwon-si (KR)

(72) Inventors: Jaerin Lee, Yongin-si (KR); Yang Azevedo Tavares, Gwangju (KR); Minjae Lee, Gwangju (KR); Kyeongkeun Kang, Suwon-si (KR)

(73) Assignees: SAMSUNG ELECTRONICS CO., LTD., Suwon-si (KR); GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 149 days.

(21) Appl. No.: 17/863,167

(22) Filed: Jul. 12, 2022

(65) Prior Publication Data

US 2023/0011449 A1 Jan. 12, 2023

(30) Foreign Application Priority Data

Jul. 12, 2021 (KR) .......................... 10-2021-0090898

(51) Int. Cl.
  *H03M 1/10* (2006.01)
  *H03M 1/06* (2006.01)
(52) U.S. Cl.
  CPC ................................ *H03M 1/0604* (2013.01)
(58) Field of Classification Search
  CPC .. H03M 1/1215; H03M 1/1009; H03M 1/121; H03M 1/0626; H03M 1/0624;
  (Continued)

(56) References Cited

U.S. PATENT DOCUMENTS 7,330,140 B2 2/2008 Balakrishnan et al.
7,916,050 B1 * 3/2011 Mujica .................. H03M 1/004
  455/108

(Continued)

OTHER PUBLICATIONS

Lim et al., "Time-Interleaved Analog-to-Digital-Converter Compensation Using Multichannel Filters", IEEE Transactions on Circuits and Systems—1: Regular Papers, vol. 56, No. 10, Oct. 2009, (14 total pages).

(Continued)

*Primary Examiner* — Linh V Nguyen
(74) *Attorney, Agent, or Firm* — Sughrue Mion, PLLC

(57) ABSTRACT

An apparatus and a method of correcting a mismatch of a time-interleaved analog-to-digital converter are provided. The apparatus may include: a time-interleaved analog-to-digital converter configured to receive a non-return-to-zero (NRZ) signal in a correction mode and generate a first output signal, and including a plurality of analog-to-digital converters; and a mismatch corrector configured to generate a second output signal by processing the first output signal of the time-interleaved analog-to-digital converter based on parameters, wherein the parameters may be generated based on the first output signal of the time-interleaved analog-to-digital converter in the correction mode, and a period of the NRZ signal may be different from a product of a sampling period of the time-interleaved analog-to-digital converter and a number of the plurality of analog-to-digital converters included in the time-interleaved analog-to-digital converter.

19 Claims, 15 Drawing Sheets

(58) Field of Classification Search
CPC .... H03M 1/1004; H03M 1/1033; H03M 1/12; H03M 1/0609; H03M 1/0836; H03M 1/1028; H03M 1/1038; H03M 1/1225; H03M 1/1245; H03M 1/00; H03M 1/002; H03M 1/0617; H03M 1/066; H03M 1/0678; H03M 1/0687; H03M 1/0695; H03M 1/1023; H03M 1/1042; H03M 1/1052; H03M 1/124; H03M 1/46; H03M 1/662; H03M 3/47; H03M 1/06; H03M 1/0612; H03M 1/0634; H03M 1/0639; H03M 1/08; H03M 1/10; H03M 1/1014; H03M 1/1057; H03M 1/1061; H03M 1/1085; H03M 1/1205; H03M 1/123; H03M 1/168; H03M 1/181; H03M 1/36; H03M 3/358; H03M 3/37; H03M 3/454; H03M 3/46; H03M 3/468; H03M 3/50; H03M 3/502; H03M 7/165
USPC .................................. 341/118–120, 141, 155
See application file for complete search history.

(56) References Cited

U.S. PATENT DOCUMENTS

| | | | |
|---|---|---|---|
| 8,519,875 B2 | 8/2013 | Straayer et al. | |
| 8,957,798 B1 | 2/2015 | Harris | |
| 9,143,147 B1* | 9/2015 | Ray | H03M 1/12 |
| 9,294,112 B1* | 3/2016 | Devarajan | H03M 1/0836 |
| 9,337,993 B1* | 5/2016 | Lugthart | H04L 7/0037 |
| 9,385,737 B1 | 7/2016 | Yu et al. | |
| 9,401,726 B2 | 7/2016 | Ragab et al. | |
| 10,312,927 B1 | 6/2019 | Mirhaj et al. | |
| 10,833,693 B2 | 11/2020 | Bjork et al. | |
| 2014/0253352 A1* | 9/2014 | Oshima | H03M 1/1038 |
| | | | 341/118 |
| 2014/0266823 A1* | 9/2014 | Biallais | H03M 1/0607 |
| | | | 341/118 |
| 2015/0188555 A1* | 7/2015 | Kimura | H03M 1/002 |
| | | | 341/118 |
| 2015/0341044 A1* | 11/2015 | Nakamura | H03M 1/0624 |
| | | | 341/118 |
| 2016/0079994 A1* | 3/2016 | Lee | H03M 1/46 |
| | | | 341/118 |
| 2016/0149582 A1* | 5/2016 | Ragab | H03M 1/121 |
| | | | 341/120 |
| 2017/0117914 A1* | 4/2017 | Choi | H03M 1/1033 |
| 2018/0138919 A1* | 5/2018 | Björk | H03M 1/1215 |
| 2021/0135678 A1* | 5/2021 | Pu | H03M 1/1028 |
| 2021/0159908 A1* | 5/2021 | Singh | H03M 1/0626 |

OTHER PUBLICATIONS

Park et al., "A Scalable Bandwidth Mismatch Calibration Technique for Time-Interleaved ADCs", IEEE Transactions on Circuits and Systems—I: Regular Papers, vol. 63, No. 11, Nov. 2016, (9 pages total).

Tavares et al., "A Foreground Calibration for M-Channel Time-Interleaved Analog-to-Digital Converters Based on Genetic Algorithm", IEEE Transactions on Circuits and Systems—I: Regular Papers, vol. 68, No. 4, Apr. 2021, (14 pages total).

Texas Instruments, "ADC12D1800 12-bit, dual 1.8GSPS or single 3.6GSPS ADC reference board", Evaluation board | TI.com, https://www.ti.com/tool/ADC12D1800RB, (4 pages total)Nov. 4, 2021.

Qiu et al., An Adaptive Blind Calibration Technique for Frequency Response Mismatches in M-Channel Time-Interleaved ADCs, IEEE Transactions on Circuits and Systems II: Express Briefs, vol. 66, Issue 4, Sep. 19, 2018, (6 pages total).

Khalil et al., "Background analog and mixed signal calibration system for time-interleaved ADC", Microelectronics Journal, www.elsevier.com/locate/mejo, Apr. 23, 2015, (12 pages total).

Johansson, "A Polynomial-Based Time-Varying Filter Structure for the Compensation of Frequency-Response Mismatch Errors in Time-Interleaved ADCs", IEEE Journal of Selected Topics in Signal Processing, vol. 3, No. 3, Jun. 2009, (13 total pages).

* cited by examiner

APPARATUS AND METHOD FOR CALIBRATING MISMATCHES OF TIME-INTERLEAVED ANALOG-TO-DIGITAL CONVERTER

CROSS-REFERENCE TO RELATED APPLICATION

This application is based on and claims priority under 35 U.S.C. § 119 to Korean Patent Application No. 10-2021-0090898, filed on Jul. 12, 2021 in the Korean Intellectual Property Office, the disclosure of which is incorporated by reference herein in its entirety.

BACKGROUND

The inventive concept relates to an analog-to-digital converter, and more particularly, to an apparatus and method for correcting mismatches of a time-interleaved analog-to-digital converter.

Analog-to-digital converters are used in various applications, and particularly, the analog-to-digital converters used for high speed communication, signal analyzers, or the like, may have high sampling rates. To realize the high sampling rate, the time-interleaved analog-to-digital converters may include a plurality of analog-to-digital converters receiving inputs in common, and the plurality of analog-to-digital converters may sample inputs at different time points, respectively. However, due to variation of the analog-to-digital converters, variation of signal paths, or the like, the time-interleaved analog-to-digital converters may have various mismatches. Accordingly, an accurate correction of mismatches of the time-interleaved analog-to-digital converters is required.

SUMMARY

The inventive concept provides an apparatus and method for correcting various mismatches of a time-interleaved analog-to-digital converter.

According to an embodiment, there is provided an apparatus including: a time-interleaved analog-to-digital converter configured to receive a non-return-to-zero (NRZ) signal in a correction mode and generate a first output signal, and including a plurality of analog-to-digital converters; and a mismatch corrector configured to generate a second output signal by processing the first output signal from the time-interleaved analog-to-digital converter based on parameters, wherein the parameters are generated based on the first output signal of the time-interleaved analog-to-digital converter in the correction mode, and wherein a period of the NRZ signal is different from a product of a sampling period of the time-interleaved analog-to-digital converter and a number of the plurality of analog-to-digital converters included in the time-interleaved analog-to-digital converter.

According to an embodiment, there is provided a method of correcting mismatch of a time-interleaved analog-to-digital converter including a plurality of analog-to-digital converters. The method includes: providing a non-return-to-zero (NRZ) signal to the time-interleaved analog-to-digital converter in a correction mode; generating parameters based on a first output signal of the time-interleaved analog-to-digital converter in the correction mode; and generating a second output signal by processing the first output signal based on the parameters, wherein a period of the NRZ signal is different from a product of a sampling period of the time-interleaved analog-to-digital converter and a number of the plurality of analog-to-digital converters included in the time-interleaved analog-to-digital converter.

According to an embodiment, there is provided a method of correcting mismatch of a time-interleaved analog-to-digital converter including a plurality of analog-to-digital converters. The method includes: generating parameters based on a first output signal output from the time-interleaved analog-to-digital converter; and generating a second output signal by processing the first output signal based on the parameters, wherein the generating the parameters includes evaluating a fitness of the parameters, according to a genetic algorithm.

BRIEF DESCRIPTION OF THE DRAWINGS

Embodiments of the inventive concept will be more clearly understood from the following detailed description taken in conjunction with the accompanying drawings, in which.

DETAILED DESCRIPTION

Figure 1:
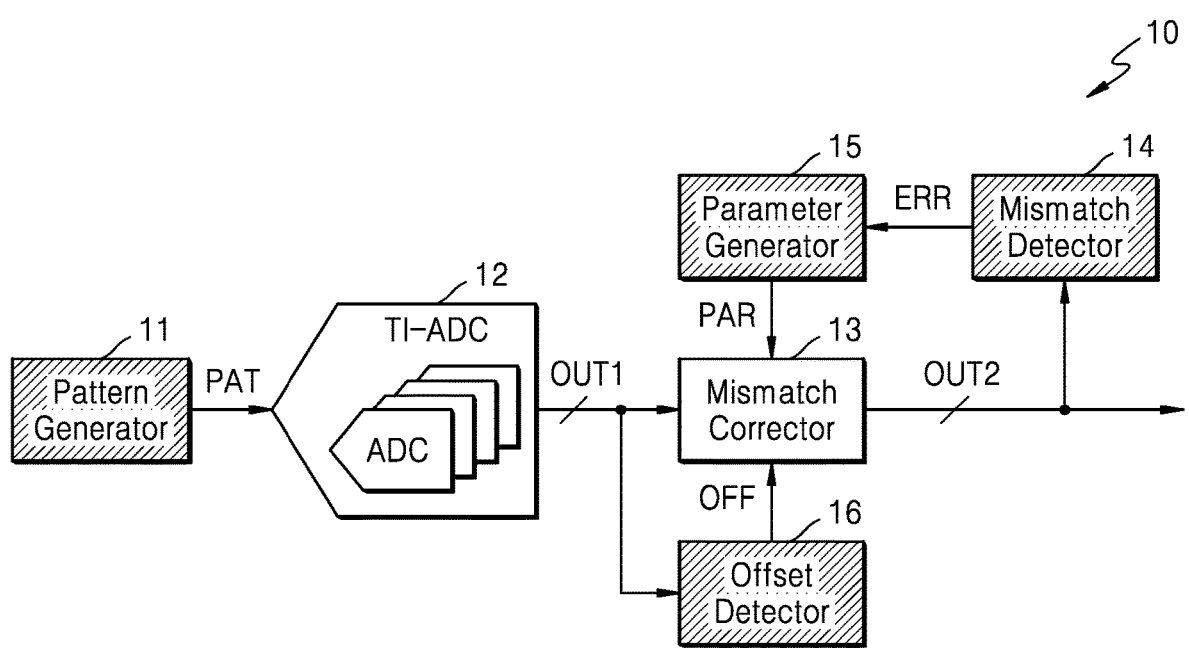
FIG. 1 is a block diagram of an apparatus according to an example embodiment.

FIG. 1 is a block diagram of an apparatus 10 according to an embodiment. As illustrated in FIG. 1, the apparatus 10 may include a pattern generator 11, a time-interleaved analog-to-digital converter (TI-ADC) 12, a mismatch corrector 13, a mismatch detector 14, a parameter generator 15, and an offset detector 16.

Various functions described below may be implemented or supported by artificial intelligence technology or one or more computer programs. Each of the computer programs may include computer-readable program code that may be stored in a computer-readable medium, and may be executable by at least one processor that can access the computer-readable medium. The terms "application" and "program" may be referred to as one or more computer programs, software components, instruction sets, procedures, functions, objects, classes, instances, related data, or the like suitable for implementation by computer-readable program code. The term "computer-readable program code" may include all types of computer code including source code, object code, and executable code. The term "computer-readable medium" may include all types of media accessible by a computer, such as read-only memory (ROM), random access memory (RAM), a hard disk drive, a compact disk (CD), a digital video disk (DVD), or some other type of memory. The term "non-transitory" computer-readable media may not include transient electrical signals or other signals. The non-transitory computer-readable media may include media on which data is permanently stored, and media on which data is stored and later overwritten, such as a rewritable optical disk and an erasable memory device.

In addition, in various embodiments of the inventive concept described below, a hardware approach method is described as an example. However, the one or more embodiments of the disclosure are not limited thereto, and the inventive concept may implement both hardware and software, and may not exclude a software-based approach method.

The apparatus 10 may include an integrated circuit manufactured by using a semiconductor process, and may be included in a die (or a chip). In some embodiments, the apparatus 10 may include two or more semiconductor packages and a printed circuit board (PCB) on which the semiconductor packages are mounted. In some embodiments, a pattern generator 11, the mismatch detector 14, the parameter generator 15, and the offset detector 16 may be enabled in a correction mode, and may be disabled in a normal mode. In some embodiments, the apparatus 10 may include the TI-ADC 12 and the mismatch corrector 13, which operate in the normal mode, and in the correction mode, the pattern generator 11, the mismatch detector 14, the parameter generator 15, and the offset detector 16 may be connected to the apparatus 10.

The pattern generator 11 may generate a pattern signal PAT in the correction mode. In some embodiments, as described below with reference to FIG. 2, the pattern signal PAT may be a non-return-to-zero (NRZ) signal, and accordingly, the pattern generator 11 may have a simple structure. When, unlike the pattern generator 11 in FIG. 1, sine waves are used for correcting mismatches dependent on a frequency of the TI-ADC 12, a complicated structure for generating a sine wave may be required, and a high cost (for example, time) for correction may be required due to sine waves of various frequencies for correction in a wide frequency range. Thus, according to the embodiments of the disclosure, the pattern generator 11 may have a simple structure to generate a simple pattern signal PAT, and may correct mismatches of the TI-ADC 12 in a wide frequency range. In some embodiments, as described below with reference to FIG. 12, the apparatus 10 may be included in a transceiver for communication, and in the correction mode, a transmitter included in the transceiver may function as the pattern generator 11.

The TI-ADC 12 may generate a first output signal OUT1, which is a digital signal, by converting an input signal, which is an analog signal. In the normal mode, the TI-ADC 12 may receive an analog input signal requiring digital conversion, and generate the first output signal OUT1 by converting the analog input signal into the digital output signal. On the other hand, in the correction mode, the TI-ADC 12 may, as illustrated in FIG. 1, receive the pattern signal PAT from the pattern generator 11, and generate the first output signal OUT1 by converting the pattern signal PAT.

As illustrated in FIG. 1, the TI-ADC 12 may include a plurality of analog-to-digital converters. The plurality of analog-to-digital converters may receive the input signal in common (or in time sharing), and each of the plurality of analog-to-digital converters may output a digital signal corresponding to a magnitude of the input signal. Each of the plurality of analog-to-digital converters may be synchronized with a clock signal, and the clock signal may be provided to the plurality of analog-to-digital converters at different phases. Accordingly, while the TI-ADC 12 may have a high sampling speed, the first output signal OUT1 from the TI-ADC 12 may have various mismatches. That is, due to variations of the plurality of analog-to-digital converters, variations of a plurality of signal paths, or the like, mismatches may occur in various characteristics of the TI-ADC 12, for example, an offset, a gain, a skew, a bandwidth, etc. Herein, the TI-ADC 12 is assumed to include M analog-to-digital converters, where M is an integer greater than 1.

The mismatch corrector 13 may receive the first output signal OUT1 from the TI-ADC 12, and generate a second output signal OUT2 in which mismatches of the TI-ADC 12 has been corrected. As illustrated in FIG. 1, the mismatch corrector 13 may receive parameters PAR from the parameter generator 15, and may generate the second output signal OUT2 by processing the first output signal OUT1 based on the parameters PAR. Accordingly, appropriate parameters PAR may be required for generating the second output signal OUT2 in which mismatches in the first output signal OUT1 are corrected. In addition, as illustrated in FIG. 1, the mismatch corrector 13 may receive an offset signal OFF from the offset detector 16, and may process the first output signal OUT1 based on the offset signal OFF as well as the parameters PAR.

In some embodiments, the mismatch corrector 13 may process the first output signal OUT1 in the normal mode based on the parameters PAR and offset values stored in a memory. For example, the mismatch corrector 13 may include a memory or access a memory, and the memory may store the parameters PAR provided by the parameter generator 15 and a value of the offset signal OFF provided by the offset detector 16 when the correction mode is terminated. Accordingly, even though the parameter generator 15 and the offset detector 16 are disabled in the normal mode, the mismatch corrector 13 may correct mismatches based on the parameters PAR and the offset values stored in the memory. An example of an operation of the mismatch corrector 13 is described below with reference to FIG. 3.

The mismatch detector 14 may receive the second output signal OUT2 from the mismatch corrector 13 in the correction mode, and may detect mismatches of the TI-ADC 12 based on the second output signal OUT2. In some embodiments, the mismatch detector 14 may remove only frequency components of the pattern signal PAT in the second output signal OUT2, and may detect spurs occurring due to the pattern signal PAT in a frequency domain. In an ideal case, that is, when there is no mismatch in the TI-ADC 12, the magnitude of the spurs may be about zero. Accordingly, the mismatch detector 14 may detect mismatches based on the magnitude of the spurs detected in the second output signal OUT2, and generate an error signal ERR corresponding to the detected mismatches. An example of the mismatch detector 14 is described with reference to FIG. 4.

The parameter generator 15 may receive the error signal ERR from the mismatch detector 14, and generate the parameters PAR from the error signal ERR. The parameter generator 15 may generate the parameters PAR to reduce mismatches indicated by the error signal ERR, and provide the generated parameters PAR to the mismatch corrector 13. The parameter generator 15 may generate the parameters PAR again based on the second output signal OUT2 and the error signal ERR, which are generated in response to the parameters PAR. The generation of the parameters PAR may be repeated until mismatches are corrected to a desired level. In some embodiments, the parameter generator 15 may generate the parameters PAR based on a genetic algorithm to determine optimum parameters PAR. An example of an operation of the parameter generator 15 is described with reference to FIG. 7.

The offset detector 16 may detect an offset of the TI-ADC 12. For example, as described below with reference to FIG. 10, the offset detector 16 may detect the offset of the TI-ADC 12 based on the first output signal OUT1 at a time point of entering the correction mode, and may generate the offset signal OFF indicating the detected offset. The offset detector 16 may detect the offset of the TI-ADC 12 by using various methods. For example, while a constant level (for example, a zero voltage) is applied to the TI-ADC 12, the offset detector 16 may detect the offset of the TI-ADC 12 by averaging the first output signals OUT1 generated by the TI-ADC 12.

In the apparatus 10, various mismatches of the TI-ADC 12 may be corrected at once, and accordingly, a high speed conversion of high quality may be achieved. In addition, a simple test signal for a foreground calibration may be used, and accordingly, overhead for correction may be reduced and at the same time, frequency-dependent mismatches in a wide frequency range may be simultaneously corrected at one time. In addition, an optimum correction of mismatches may be achieved by applying the genetic algorithm.

In some embodiments, at least one of the mismatch corrector 13, the mismatch detector 14, the parameter generator 15, and the offset detector 16 may correspond to a software module. For example, at least one of the mismatch corrector 13, the mismatch detector 14, the parameter generator 15, and the offset detector 16 may correspond to a software module executed by a programmable component such as a central processing unit (CPU), a graphics processing unit (GPU), a neural processing unit (NPU), and a digital signal processor (DSP). Accordingly, the mismatch detector 14, the parameter generator 15, and the offset detector 16 may be executed by the programmable component in the correction mode. In some embodiments, at least one of the mismatch corrector 13, the mismatch detector 14, the parameter generator 15, and the offset detector 16 may be implemented by an independent hardware block. For example, at least one of the mismatch corrector 13, the mismatch detector 14, the parameter generator 15, and the offset detector 16 may be implemented by a component or a module designed to perform a fixed function or by a reconfigurable component such as a field programmable gate array (FPGA).

Figure 2:
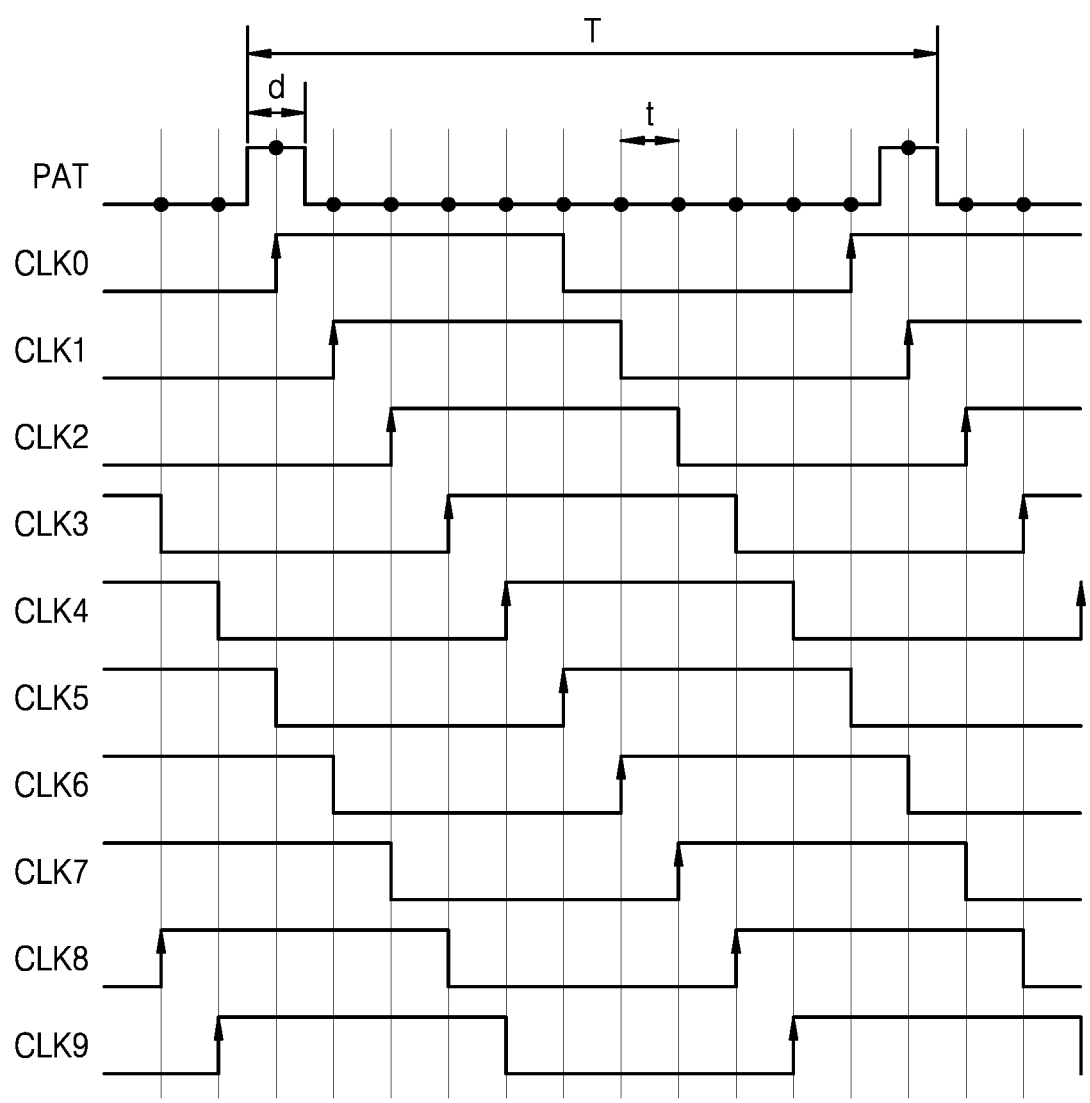
FIG. 2 is a timing diagram of an operation of correcting a time-interleaved analog-to-digital converter, according to an example embodiment.

FIG. 2 is a timing diagram of an operation of correcting the TI-ADC 12, according to an example embodiment. The timing diagram in FIG. 2 illustrates the pattern signal PAT, and a plurality of clock signals provided to the plurality of analog-to-digital converters included in the TI-ADC 12 in FIG. 1. In an example of FIG. 2, the TI-ADC 12 is assumed to include 10 analog-to-digital converters (that is, M=10), and accordingly, first through tenth clock signals CLK0 through CLK9 may be provided to the TI-ADC 12. Hereinafter, FIG. 2 is described with reference to FIG. 1.

Referring to FIG. 2, the first through tenth clock signals CLK0 through CLK9 may have different phases from each other, and input signal may be sampled at rising edges of the first through tenth clock signals CLK0 through CLK9. As illustrated in FIG. 2, an interval between adjacent rising edges, that is, a time t, may be a sampling period of the TI-ADC 12, and accordingly, a sampling frequency may be 1/t. In some embodiments, the input signal may also be sampled at falling edges of the first through tenth clock signals CLK0 through CLK9. In addition, the first through tenth clock signals CLK0 through CLK9 may also have different duty cycles from each other as illustrated in FIG. 2.

In the correction mode, the pattern signal PAT generated by the pattern generator 11 may be the NRZ signal. For example, as illustrated in FIG. 2, the pattern signal PAT may have a period T, and the NRZ signal is activated during an interval d. The pattern signal PAT may be expressed in Equation 1 below.

$$s(x) = \begin{cases} 1, & 0 \le x < d \\ -1, & d \le x \le T \end{cases} \quad \text{[Equation 1]}$$

Here, s may represent the pattern signal PAT, and x may represent time. In addition, a sample sequence s[n] generated by sampling the pattern signal PAT may be expressed in Equation 2 below.

$$s[n] = \frac{d}{T} - \frac{1}{2} + \sum_{l=1}^{\lfloor T/2 \rfloor} \frac{4\sin(l\pi d/T)}{l\pi} \cos\left(\frac{l2\pi}{T}(n - d/2)\right) \quad \text{[Equation 2]}$$

The pattern generator 11 may have a simple structure for generating the NRZ signal, unlike a structure for generating a signal such as a sine wave in which a magnitude thereof is continuously changing. For example, the pattern generator 11 may include a switch, which is turned on (or turned off) during the interval d, and turned off (or turned on) during a time T-d. As described below with reference to FIG. 5A, a square wave like the NRZ signal may have various frequency components, that is, a plurality of harmonics in the frequency domain. Accordingly, as described below with reference to FIG. 5B, the TI-ADC 12 may generate the first output signal OUT1 including a frequency response in a wide frequency range in response to the harmonics of the NRZ signal. Hereinafter, the pattern signal PAT is assumed to be the NRZ signal (or a pulse signal) as illustrated in FIG. 2.

In some embodiments, the pattern signal PAT may have a low duty cycle (or a high duty cycle). When the duty cycle of the pattern signal PAT approaches about 50%, the harmonics of high frequencies may be reduced, and in this case, it may not be easy to observe frequency characteristics of the TI-ADC 12 in a high frequency range. Accordingly, the interval d of the pattern signal PAT may be very short or very long. In some embodiments, a duty cycle d/T of the pattern signal PAT may be equal to or less than 1/M (d/T≤1/M), where M is the number of analog-to-digital converters. In addition, in some embodiments, the duty cycle d/T of the pattern signal PAT may be equal to or greater than a value of (1−1/M), which is a result of subtracting 1/M, or an inverse of the number of analog-to-digital converters, from 1 (d/T≥1−1/M).

In some embodiments, the pattern signal PAT may not be synchronized with the first through tenth clock signals CLK0 through CLK9. For example, the period T of the pattern signal PAT may be different from a product of the sampling period t of the TI-ADC 12 and M, which is the number of analog-to-digital converters included in the TI-ADC 12 (T≠t*M). For example, when the sampling period t in FIG. 2 is about 0.1 ns, the period T of the pattern signal PAT may be about 1.1 ns. Since the number of analog-to-digital converters M is 10, the product of the sampling period t and the number of analog-to-digital converters M (0.1 ns*10) is about 1 ns. That is, the period T of the pattern signal PAT of about 1.1 ns is different from the product of the sampling period 0.1 ns and 10. In addition, in some embodiments, when the period T of the pattern signal PAT corresponds to a product of the sampling period t of the TI-ADC 12, a greatest common divisor (GCD) of T/t, which is a value obtained by dividing the period T of the pattern signal PAT by the sampling period t of the TI-ADC 12, the number of analog-to-digital converters M may be 1. In other words, a least common multiple (LCM) of the value of T/t and M may be M*T/t, which is a product of the value of T/t and M. Accordingly, by sampling the pattern signal PAT by each of the plurality of analog-to-digital converters included in the TI-ADC 12, outputting only the same value (for example, 0) may be prevented, and each of the plurality of analog-to-digital converters may be observed.

Figure 3:
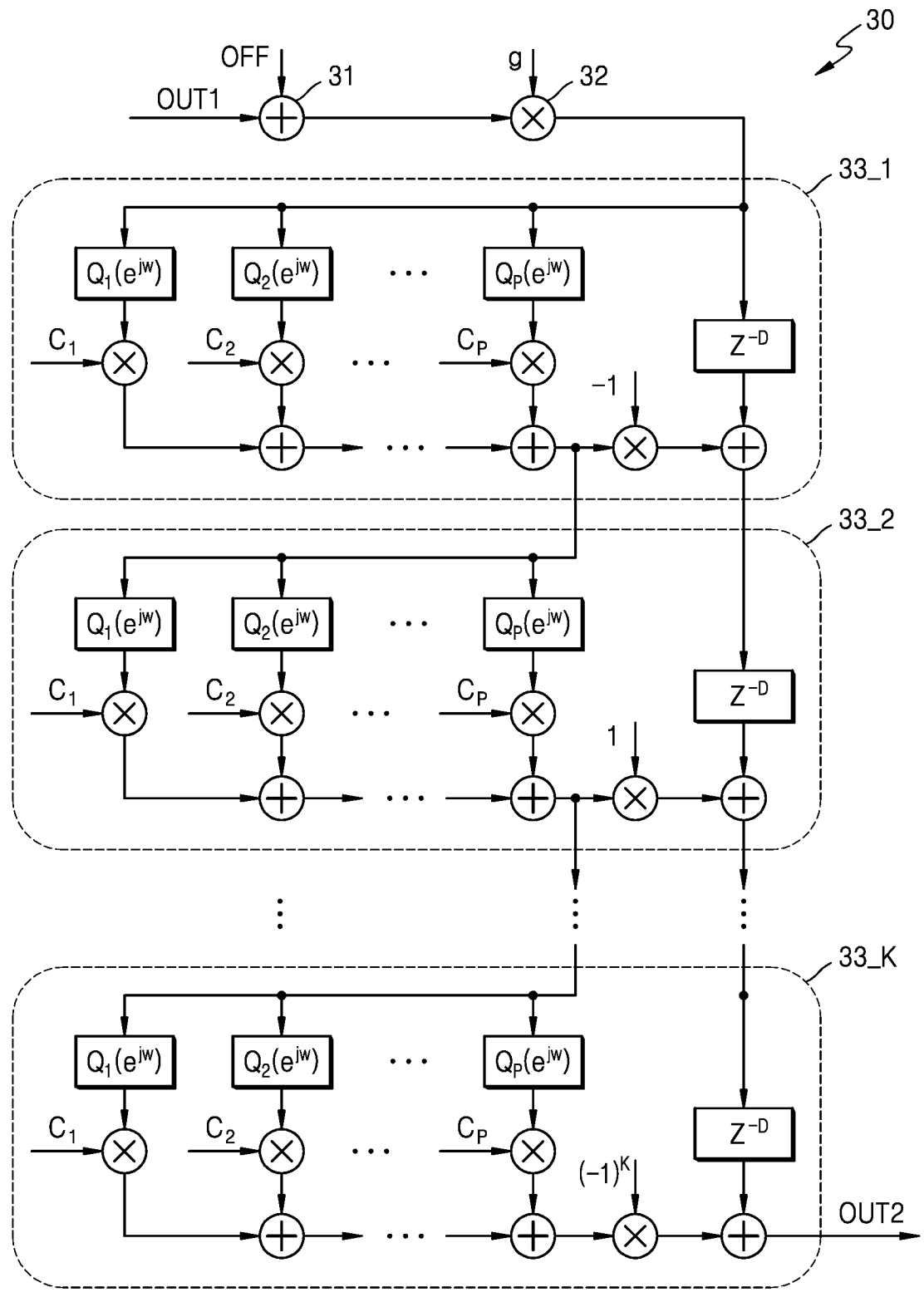
FIG. 3 is a diagram of an operation of a mismatch corrector, according to an example embodiment.

FIG. 3 is a diagram of an operation of the mismatch corrector 30, according to an example embodiment. In some embodiments, at least one of components of the mismatch corrector 30 illustrated in FIG. 3 may include a logic circuit. In some embodiments, at least one of the components of the mismatch corrector 30 illustrated in FIG. 3 may also include programmable components and software executed thereby. Hereinafter, FIG. 3 is described with reference to FIG. 1.

Referring to FIG. 3, the mismatch corrector 30 may receive the first output signal OUT1, and may include an adder 31 that adds the offset signal OFF to the first output signal OUT1. As described above with reference to FIG. 1, the offset signal OFF may be provided by the offset detector 16, and the offset detector 16 may generate the offset signal OFF so that offset mismatches of the TI-ADC 12 are compensated for. An output of the adder 31 may be provided to a multiplier 32, and the multiplier 32 may multiply the output of the adder 31 by a gain g. The gain g may be included in the parameters PAR together with parameters described below, and may be provided by the parameter generator 15.

The mismatch corrector 30 may include first through $K^{th}$ stages 33_1 through 33_K, and each of the stages 33_1 through 33K may perform computations corresponding to a P-order equation (P and K are integers greater than zero). For example, the TI-ADC 12 may be modeled by Equation 3 below in the frequency domain.

$$Y(e^{j\omega}) = \frac{1}{M}\sum_{i=0}^{M-1}\sum_{k=0}^{M-1}\left[X\left(e^{j\left(\omega-\frac{2\pi k}{M}\right)}\right)H_i\left(e^{j\left(\omega-\frac{2\pi k}{M}\right)}\right) + o_i\delta\left(e^{j\left(\omega-\frac{2\pi k}{M}\right)}\right)\right]e^{j\frac{2\pi ki}{M}}N_0.$$

In Equation 3, Y may represent the first output signal OUT1 of the TI-ADC 12 in the frequency domain, M may represent the number of analog-to-digital converters included in the TI-ADC 12, X may represent an input signal of the TI-ADC 12, $H_i$ and $o_i$ may respectively represent a transfer function and an offset of an $i^{th}$ analog-to-digital converter included in the TI-ADC 12 (1≤i≤M), and $N_0$ may represent noise. For correcting mismatches of the TI-ADC 12, which is modeled by Equation 3, the mismatch corrector 30 may perform an operation illustrated in FIG. 3.

In FIG. 3, $Q_i(e^{jw})$ may represent a fixed sub-filter (1≤i≤P), and $z^D$ may represent a delay unit. As illustrated in FIG. 3, the stages 33_1 through 33K may share first through $P^{th}$ coefficients $C_1$ through $C_P$, and the first through $P^{th}$ coefficients $C_1$ through $C_P$ may be included in the parameters PAR in FIG. 1 and provided by the parameter generator 15. As illustrated in FIG. 3, the stage 33_K may generate the second output signal OUT2.

It is important to accurately deduct values of the gain g and the first through $P^{th}$ coefficients $C_1$ through $C_P$ so that the mismatch corrector 30 corrects mismatches of the TI-ADC 12, from the first output signal OUT1. Hereinafter, examples of generating the parameters PAR including the gain g and the first through $P^{th}$ coefficients $C_1$ through $C_P$ are described with reference to the accompanying drawings.

Figure 4:
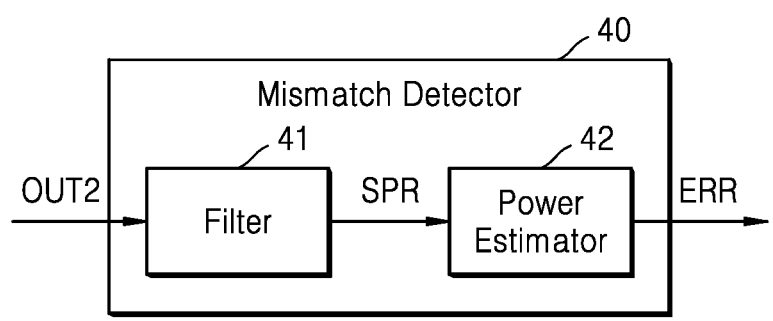
FIG. 4 is a block diagram of a mismatch detector, according to an example embodiment.
Figure 5A:
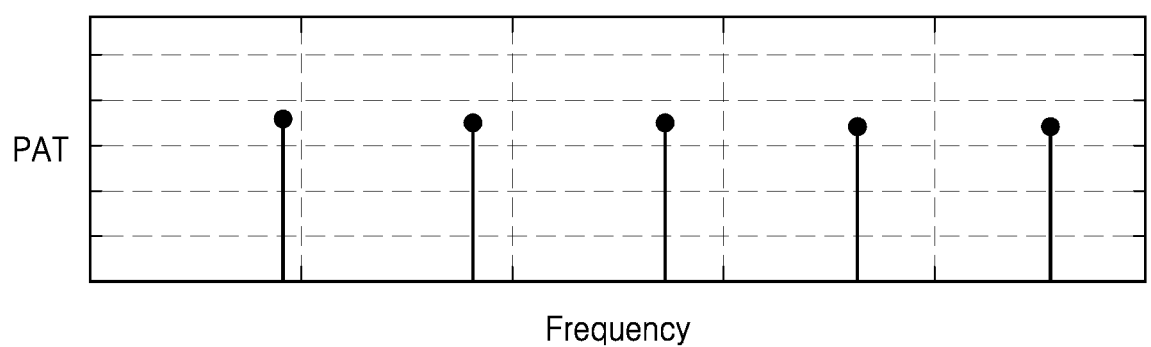
FIGS. 5A, 5B and 5C are graphs illustrating various signals of a mismatch detector in a frequency domain, according to example embodiments.
Figure 5B:
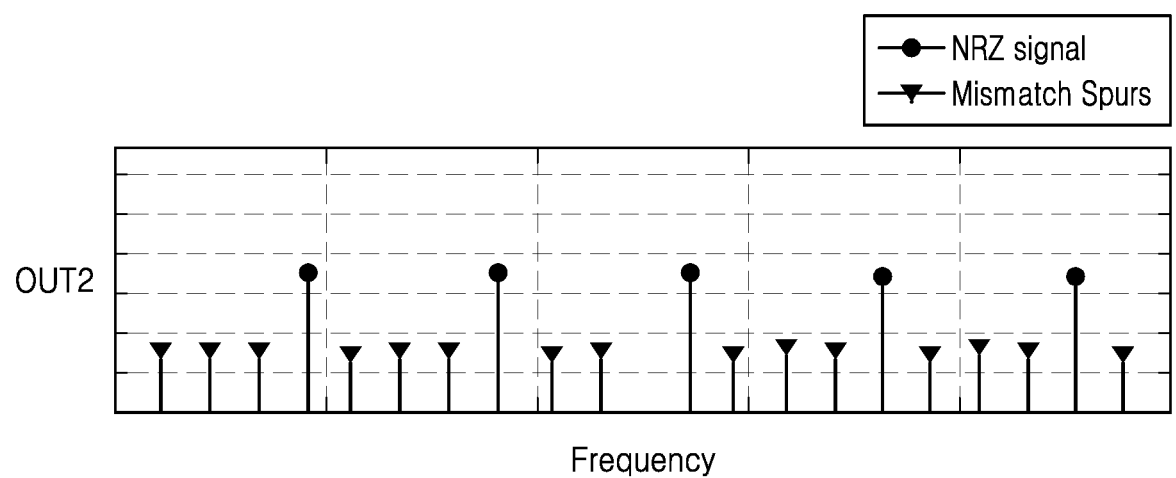
Figure 5C:
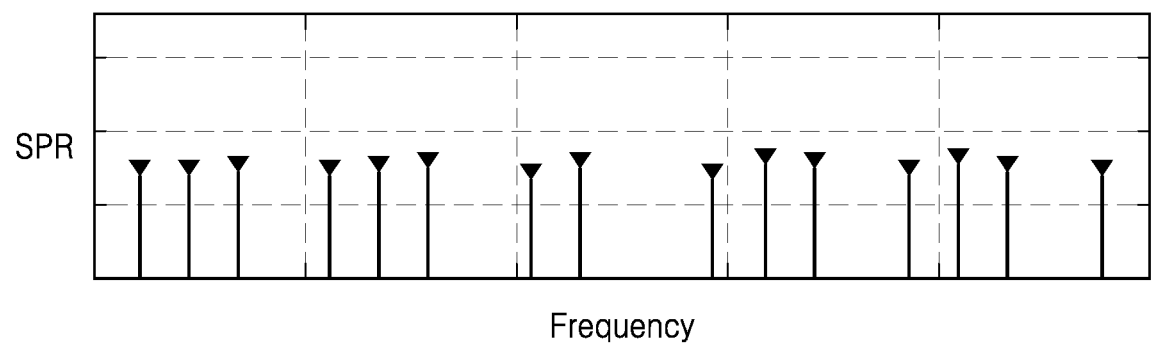
Figure 6:
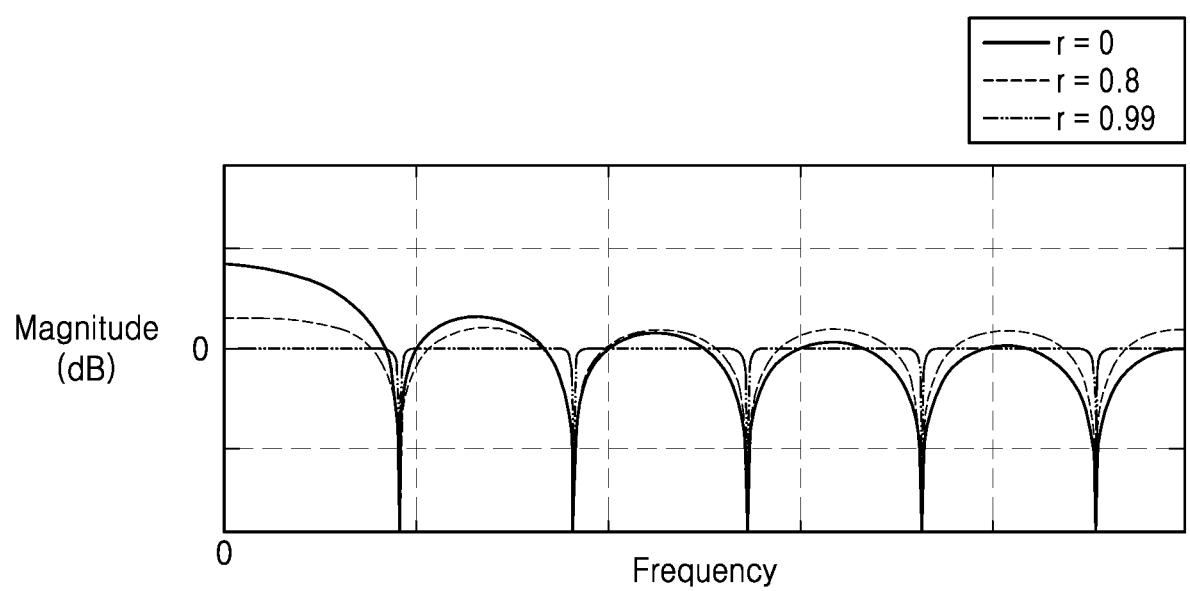
FIG. 6 is a graph of a frequency response of a filter, according to an example embodiment.

FIG. 4 is a block diagram of a mismatch detector 40, according to an example embodiment. FIGS. 5A through 5C are graphs of signals of the mismatch detector 40 in a frequency domain, according to example embodiments. FIG. 6 is a graph of a frequency response of a filter 41, according to an example embodiment. Hereinafter, FIGS. 4, 5A through 5C, and 6 are described with reference to FIG. 1.

Referring to FIG. 4, the mismatch detector 40 may receive the second output signal OUT2, and generate the error signal ERR. As described above with reference to FIG. 1, the second output signal OUT2 may be provided by the mismatch corrector 13 in FIG. 1, and the error signal ERR may be provided to the parameter generator 15 in FIG. 1. As illustrated in FIG. 4, the mismatch detector 40 may include the filter 41 and a power estimator 42.

The filter 41 may receive the second output signal OUT2, and generate a spur signal SPR. In some embodiments, the filter 41 may remove the frequency component of the pattern signal PAT from the second output signal OUT2, and output as the spur signal SPR. Accordingly, the spur signal SPR may only include frequency components that are generated by the TI-ADC 12 in response to the pattern signal PAT, that is, the spurs. To this end, the filter 41 may include a band stop filter (BSF), and for example, a notch filter.

Referring to FIG. 5A, in the correction mode, the pattern signal PAT provided to the TI-ADC 12 may be the NRZ signal, and may have harmonics spaced apart from each other by a constant interval. Referring to FIG. 5B, the second output signal OUT2 generated by the TI-ADC 12 from the pattern signal PAT may include harmonics of the pattern signal PAT as well as the spurs (or mismatch spurs) generated in response to the harmonics of the pattern signal PAT. Referring to FIG. 5C, the spur signal SPR, in which the harmonics of the pattern signal PAT are removed by the filter 41, may include only the spurs. Referring to FIG. 6, the frequency response of the filter 41, as a notch filter, may vary according to a bandwidth r.

Referring to FIG. 4 again, the mismatch detector 40 may generate the error signal ERR based on magnitude of the spurs. As described above, the spurs may be generated by the TI-ADC 12 in response to the harmonics of the pattern signal PAT, and accordingly, when in response to the pattern signal PAT, the spurs are removed from the first output signal OUT1 generated by the TI-ADC 12 or the magnitude of the spurs are reduced, mismatches of the TI-ADC 12 may be corrected. The mismatch detector 40 may generate the error signal ERR having values proportional to the magnitude of the spurs, and the error signal ERR may represent the magnitude of the spurs from the second output signal OUT2, which has passed through the TI-ADC 12 and the mismatch corrector 13. In some embodiments, as described below, power of the spurs may be used as the magnitude of the spurs.

The power estimator 42 may receive the spur signal SPR from the filter 41, and generate the error signal ERR by measuring power of the spur signal SPR. For example, the power estimator 42 may compute absolute values of samples of the spur signal SPR output by the filter 41, and generate the error signal ERR by summing the absolute values of the samples of the spur signal SPR. Accordingly, the error signal ERR may have a value proportional to the power of the spurs.

Figure 7:
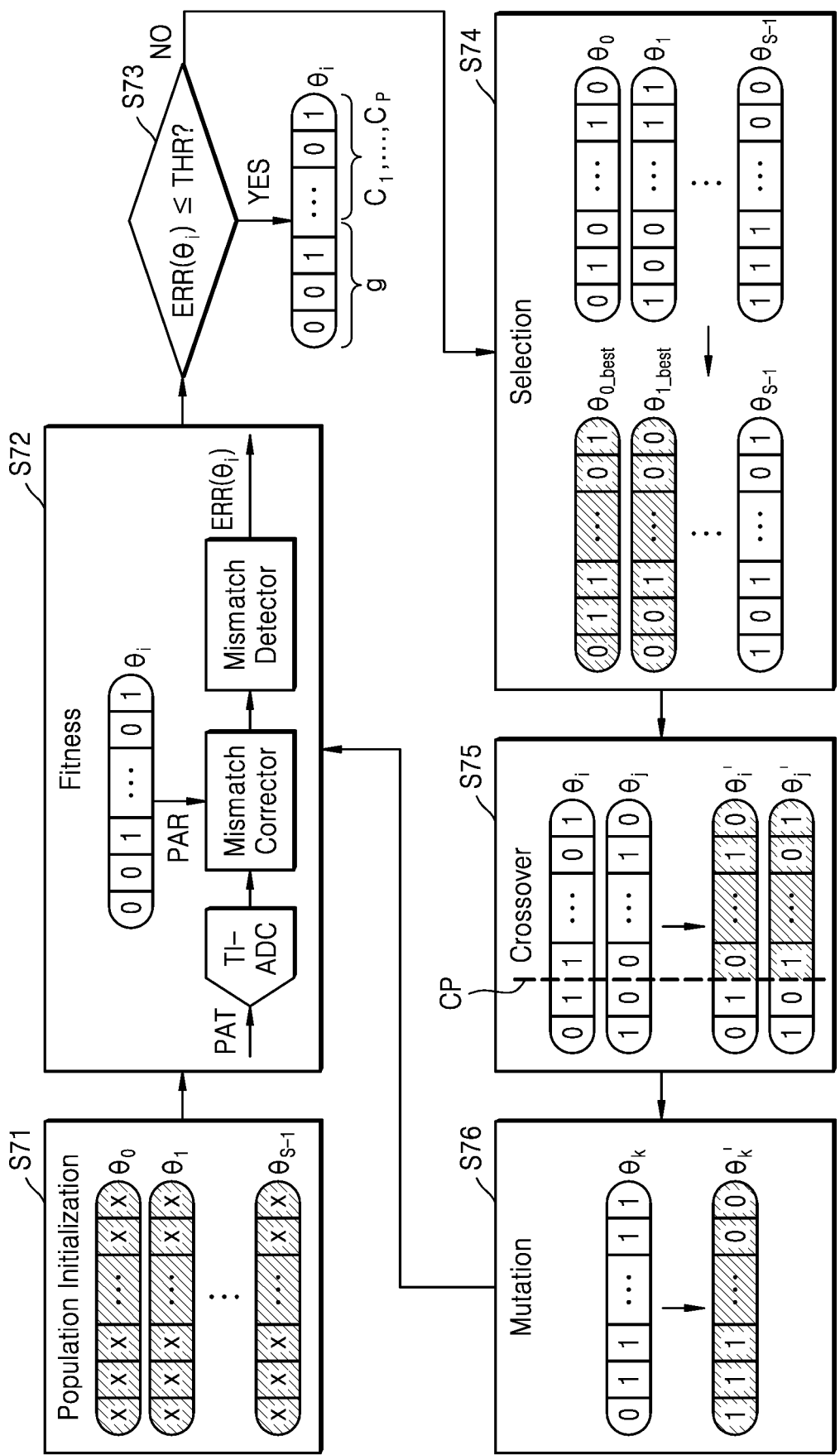
FIG. 7 is a diagram of an operation of a parameter generator, according to an example embodiment.

FIG. 7 is a diagram of an operation of the parameter generator 15, according to an example embodiment. As described above with reference to FIG. 1, the parameter generator 15 may receive the error signal ERR from the mismatch detector 14, and generate the parameters PAR based on the error signal ERR. As illustrated in FIG. 7, the parameter generator 15 may perform a plurality of operations S71 through S76. Hereinafter, FIG. 7 is described with reference to FIG. 1.

In some embodiments, the parameter generator 15 may generate optimum parameters PAR based on the genetic algorithm. Deterministic methods such as a gradient descent method may have a risk of finding a local optimum value, but the genetic algorithm may find a global optimum value at a high probability. As illustrated in FIG. 7, one chromosome $\theta_i$ may include a bit sequence, and bits of the bit sequence may correspond to the parameters PAR, that is, the gain g and values of the first through $P^{th}$ coefficients $C_1$ through $C_P$. In FIG. 7, ERR($\theta_i$) may be a value of the error signal ERR generated based on the parameters PAR corresponding to the chromosome θi, and may be referred to as an error value.

Referring to FIG. 7, a population may be initialized in operation S71. In some embodiments, the parameter generator 15 may generate S (where S is an integer greater than 0) chromosomes $\theta_0$ through $\theta_{S-1}$ based on a random number. For example, the parameter generator 15 may include a pseudo-random bit sequence (PRBS) generator or receive the PRBS from the PRBS generator, and may generate the S chromosomes $\theta_0$ through $\theta_{S-1}$ based on the PRBS.

In operation S72, the fitness of the population may be evaluated. For example, the parameter generator 15 may obtain, from the mismatch detector 14, S error signals corresponding to S groups of parameters corresponding to the S chromosomes $\theta_0$ through $\theta_{S-1}$ generated in operation S71, and may evaluate the fitness of the S chromosomes $\theta_0$ through $\theta_{S-1}$ based on the S error signals. As described above with reference to FIG. 4, the error signal ERR may have a value dependent on the magnitude of the spurs, and accordingly, an objective function may be the magnitude of the spurs in the fitness evaluation in FIG. 7.

In operation S73, the apparatus 10 determines whether the genetic algorithm has been completed. For example, when the error value ERR($\theta_i$) of the chromosome $\theta_i$ is equal to or less than a predefined threshold THR, the parameter generator 15 may output the parameters PAR corresponding to the chromosome $\theta_i$, and terminate the genetic algorithm. When the genetic algorithm is terminated, as illustrated in FIG. 7, the bit sequence corresponding to the chromosome $\theta_i$ may represent the parameters PAR, that is, the gain g and the first through $P^{th}$ coefficients $C_1$ through $C_P$, and the gain g and the first through $P^{th}$ coefficients $C_1$ through $C_P$ may have optimum values for correcting mismatches of the TI-ADC 12.

In operation S74, when, as a result of the fitness evaluation, there is no chromosome corresponding to the error signal ERR equal to or less than the threshold THR, selection operation may be performed. For example, the parameter generator 15 may align the S chromosomes $\theta_0$ through $\theta_{S-1}$ according to the S error values ERR($\theta_0$) through ERR ($\theta_{S-1}$) of the S chromosomes $\theta_0$ through $\theta_{S-1}$ included in the population obtained in operation S72, respectively. The parameter generator 15 may select two chromosomes $\theta_{0\_best}$ and $\theta_{1\_best}$ respectively corresponding to the best (or, worst) error values of the S chromosomes $\theta_0$ through $\theta_{S-1}$, which have been aligned.

In operation S75, crossover operation may be performed. For example, the parameter generator 15 may generate the chromosomes by crossing over the two chromosomes $\theta_{0\_best}$ and $\theta_{1\_best}$ selected in operation S74. In some embodiments, the parameter generator 15 may crossover bits on one side of a crossover point CP, and may change the crossover point CP. For example, as illustrated in FIG. 7, the parameter generator 15 may generate two new chromosomes $\theta_i'$ and $\theta_j'$ by crossing over bits on the right side of the crossover point CP from the two chromosomes $\theta_i$ and $\theta_j$. Accordingly, a plurality of chromosomes may be added to the population by using the two chromosomes $\theta_{0\_best}$ and $\theta_{1\_best}$ selected in operation S74.

In operation S76, mutation operation may be performed. In some embodiments, the parameter generator 15 may randomly perform the mutation operation in the population grown in operation S75. For example, the parameter generator 15 may determine whether the mutation operation is performed based on a random number, and may arbitrarily reverse some of the bits of the chromosome during the mutation operation. Accordingly, as illustrated in FIG. 7, a new chromosome $\theta_k'$, which has been mutated from a chromosome $\theta_k$, may be generated. The operation S72 may be performed again subsequent to operation S76.

Figure 8A:
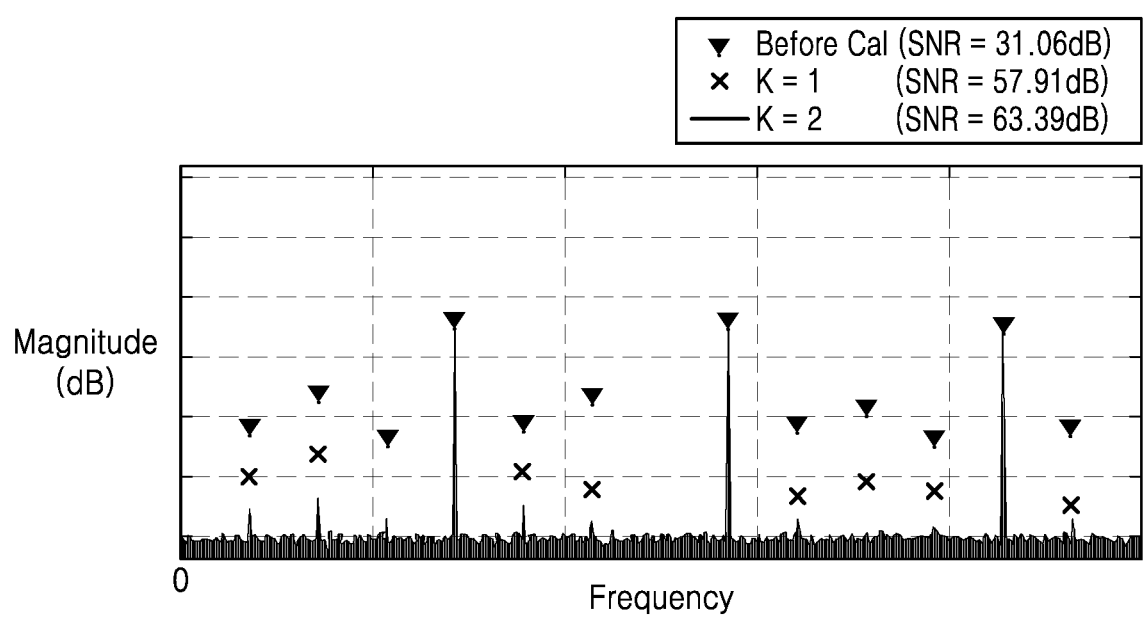
FIGS. 8A and 8B are graphs of mismatch correction performance results, according to example embodiments.
Figure 8B:
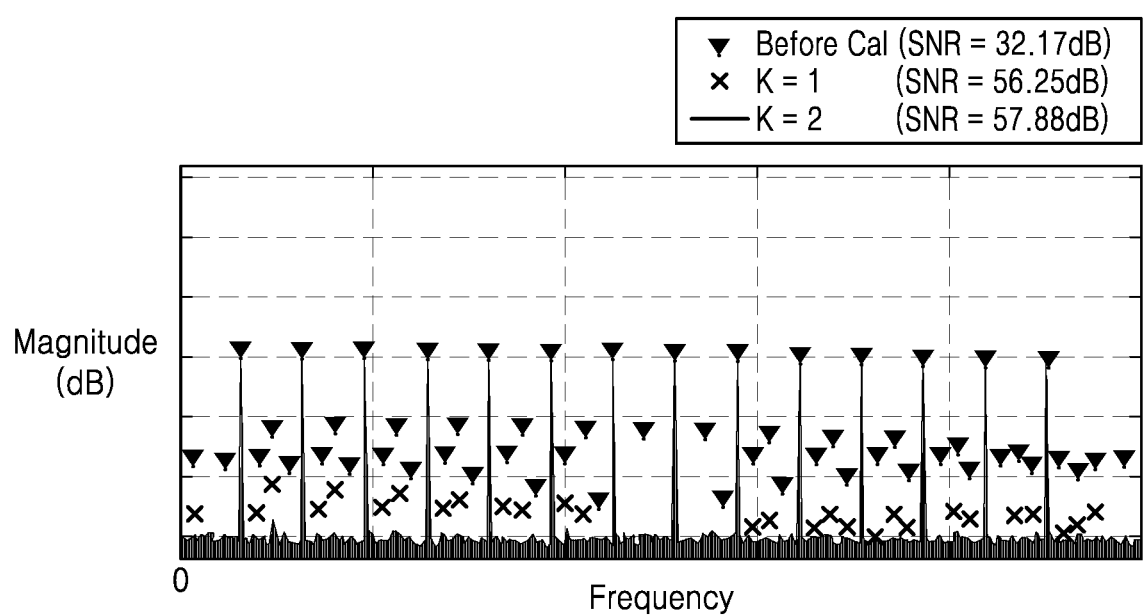

FIGS. 8A and 8B are graphs of examples of mismatch correction performance results, according to example embodiments. Graphs in FIGS. 8A and 8B illustrate results of correcting mismatches of a 12-bit 4-channel TI-ADC (M=4). In the examples of FIGS. 8A and 8B, a mismatch calibrator may include one or two stages (K=1 or 2), and one stage may operate based on a second-degree polynomial (P=2).

Referring to FIG. 8A, when a value obtained by dividing the period T of the pattern signal PAT by the sampling period t of the TI-ADC is 7 (T/t=7), and a value obtained by dividing the interval d by the sampling period t is 1 (d/t=1), the magnitude of the spurs is reduced as compared with the case with no correction. In addition, referring to FIG. 8B, also when a value obtained by dividing the period T of the pattern signal PAT by the sampling period t of the TI-ADC is 31 (T/t=31), and a value obtained by dividing the interval d by the sampling period t is 1 (d/t=1), the magnitude of the spurs is reduced as compared with the case with no correction. As illustrated in FIGS. 8A and 8B, because the frequency components of the pattern signal PAT are maintained substantially constant, when the correction is performed, a signal-to-noise ratio (SNR) may be significantly increased, and as the number of stages included in the mismatch correction is increased, thus the SNR may be further improved.

Figure 9:
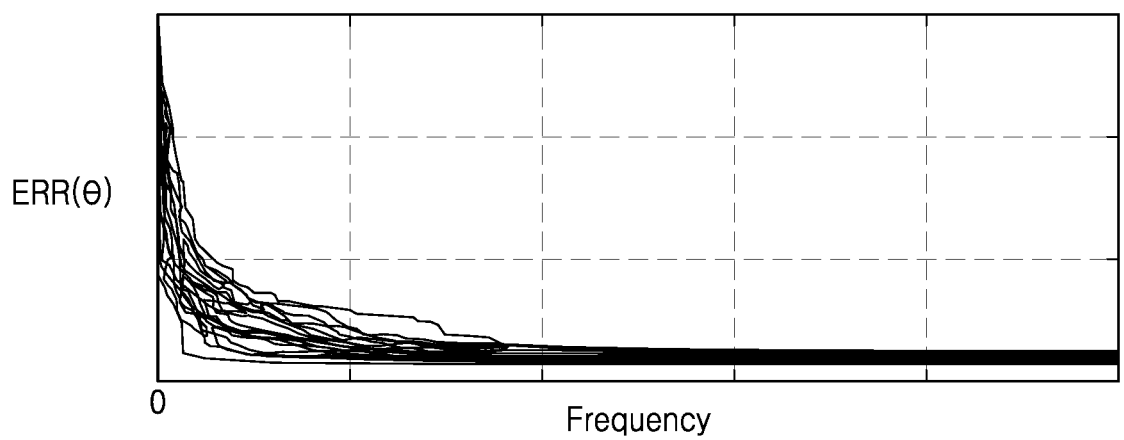
FIG. 9 is a graph of a genetic algorithm performance result, according to an example embodiment.

FIG. 9 illustrates a graph of examples of a genetic algorithm performance result, according to an example embodiment. FIG. 9 illustrates an error value ERR(O) measured at each generation of the genetic algorithm.

Referring to FIG. 9, as represented by each line of the graphs, when the generation is proceeded, the error value ERR(O) may be reduced and converged to a low value. In addition, as illustrated by a plurality of lines gradually decreasing in the graph, the parameter generator based on the genetic algorithm may generate optimum parameters, which provide the error value ERR(θ) converged to a low value.

Figure 10:
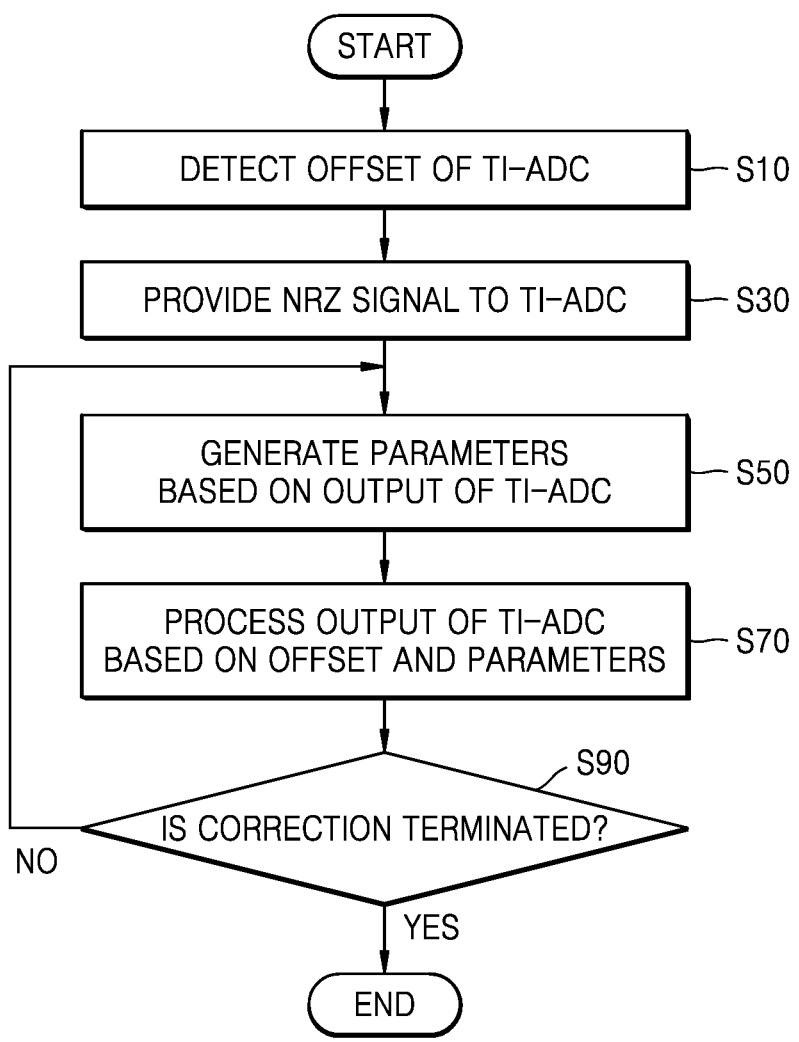
FIG. 10 is a flowchart of a correction method of a time-interleaved analog-to-digital converter, according to an example embodiment.

FIG. 10 is a flowchart of a correction method of a TI-ADC, according to an example embodiment. As illustrated in FIG. 10, the correction method of the TI-ADC may include a plurality of operations S10, S30, S50, S70, and S90. In some embodiments, the correction method of FIG. 10 may be performed by the apparatus 10 of FIG. 1, and hereinafter, FIG. 10 is described with reference to FIG. 1.

In some embodiments, the correction method of FIG. 10 may be performed in the correction mode. For example, the apparatus 10 may be set to the normal mode or the correction mode. In the correction mode, parameters for correcting mismatches may be generated, and in the normal mode, the mismatch correction may be performed based on the parameters. In some embodiments, the apparatus 10 may be set to the correction mode in a process of manufacturing the apparatus 10. In some embodiments, the apparatus 10 may be set to the correction mode when power is provided to the apparatus 10. When the correction mode is terminated, the apparatus 10 may be set to the normal mode.

In operation S10, an offset of the TI-ADC 12 may be detected. For example, at a time of entering the correction mode, an input signal of a constant level (for example, a zero voltage) may be applied to the TI-ADC 12. The offset detector 16 may detect an offset of the TI-ADC 12 based on the first output signal OUT1 generated by the TI-ADC 12. For example, the offset detector 16 may obtain the first output signal OUT1 generated by one of the analog-to-digital converters included in the TI-ADC 12, and may detect the offset of the corresponding analog-to-digital converter by averaging the first output signals OUT1. The offset detector 16 may detect M offset values corresponding to M analog-to-digital converters included in the TI-ADC 12, and may output the offset signal OFF representing an offset value among the M offset values, where the offset value corresponds to the analog-to-digital converter currently outputting the first output signal OUT1. In some embodiments, the detected M offset values may be stored in a memory (or latches) included in the offset detector 16 or in a memory accessed by the offset detector 16, and when operation S30 is terminated, the offset detector 16 may generate the offset signal OFF based on the offset values stored in the memory.

In operation S30, the NRZ signal may be provided to the TI-ADC 12. For example, in the correction mode, the pattern generator 11 may generate the pattern signal PAT. Here, the pattern signal PAT may be the NRZ signal. As described above, the NRZ signal may be simply generated, and because the NRZ signal includes a plurality of harmonics, and may be preferably used for correcting mismatches of the TI-ADC 12.

In operation S50, the parameters PAR may be generated based on an output of the TI-ADC 12. For example, the TI-ADC 12 may generate the first output signal OUT1 based on the NRZ signal. The mismatch corrector 13 may generate the second output signal OUT2 from the first output signal OUT1, based on the parameters PAR provided by the parameter generator 15 and the offset signal OFF provided by the offset detector 16. The mismatch detector 14 may generate the error signal ERR from the second output signal OUT2, and the parameter generator 15 may generate the parameters PAR from the error signal ERR. An example of operation S50 is described below with reference to FIG. 11.

In operation S70, the output of the TI-ADC 12 may be processed based on the offset and the parameters PAR. For example, the mismatch corrector 13 may generate the second output signal OUT2 by processing the first output signal OUT1 based on the offset signal OFF and the parameters PAR generated by the parameter generator 15 in operation S50. Accordingly, the second output signal OUT2 may be generated based on the parameters PAR, which are generated based on previous second output signal OUT2.

In operation S90, whether the correction is terminated may be determined. For example, when the mismatch detected from the second output signal OUT2 generated by processing the first output signal OUT1 in operation S70 is equal to or less than the predefined threshold, the mismatch detector 14 and/or the parameter generator 15 may store the parameters PAR used in operation S70 in a memory (or latches) and terminate the correction. On the other hand, when the mismatch detected from the second output signal OUT2 generated by processing the first output signal OUT1 in operation S70 exceeds a predefined threshold, as illustrated in FIG. 10, operations S50 and S70 may be performed again.

Figure 11:
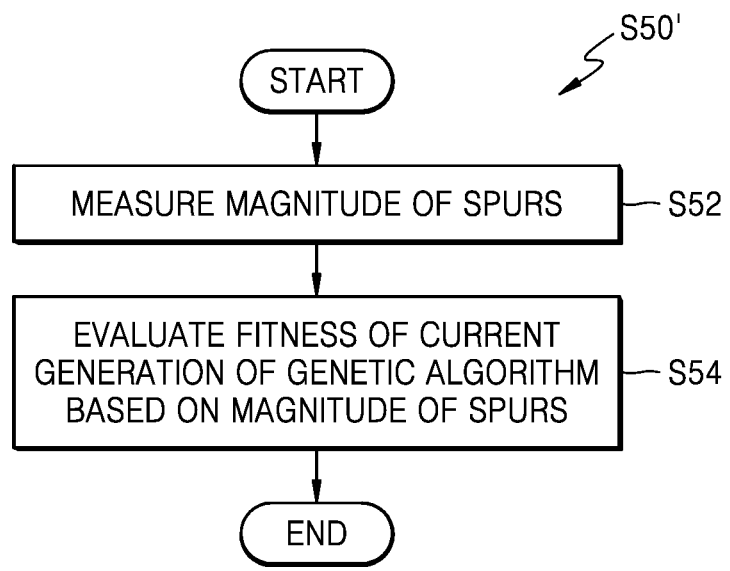
FIG. 11 is a flowchart of a correction method of a time-interleaved analog-to-digital converter, according to an example embodiment.

FIG. 11 is a flowchart of a correction method of the TI-ADC 12, according to an example embodiment. The flowchart of FIG. 11 may illustrate an example of operation S50 in FIG. 10. As described above with reference to FIG. 10, the parameters PAR may be generated based on an output of the TI-ADC 12 in operation S50'. As illustrated in FIG. 11, operation S50' may include operations S52 and S54. Hereinafter, FIG. 11 is described with reference to FIGS. 1 and 10.

Referring to FIG. 11, the magnitude of the spurs may be measured in operation S52. For example, the mismatch detector 14 may measure the magnitude of the spurs from the second output signal OUT2, which is generated by the mismatch corrector 13 by processing the first output signal OUT1 of the TI-ADC 12, based on the offset signal OFF and current parameters PAR. To this end, the mismatch detector 14 may remove the NRZ signal, that is, the frequency components of the pattern signal PAT, by filtering the second output signal OUT2. The mismatch detector 14 may estimate power of the spurs in the spur signal SPR in which the frequency components of the NRZ signal have been removed from the second output signal OUT2, and may generate the error signal ERR representing the estimated power. Accordingly, when mismatches of the TI-ADC 12 are large, the magnitude of the spurs representing the error signal ERR may be increased, and when the mismatches of the TI-ADC 12 are corrected by the mismatch corrector 13, the magnitude of the spurs representing the error signal ERR may be reduced.

In operation S54, fitness of the current generation of the genetic algorithm may be evaluated based on the magnitude of the spurs. As described above with reference to FIG. 7, the genetic algorithm may include population initialization, the fitness evaluation, the selection, the crossover, and the mutation. The parameter generator 15 may use the magnitude of the spurs measured in operation S52, for generating the parameters PAR which is capable of optimally correcting the mismatches of the TI-ADC 12. In other words, the objective function of the genetic algorithm may be based on the magnitude of the spurs corresponding to the current parameters PAR. Accordingly, the parameter generator 15 may generate the parameters PAR so that the magnitude of the spurs are reduced.

Figure 12:
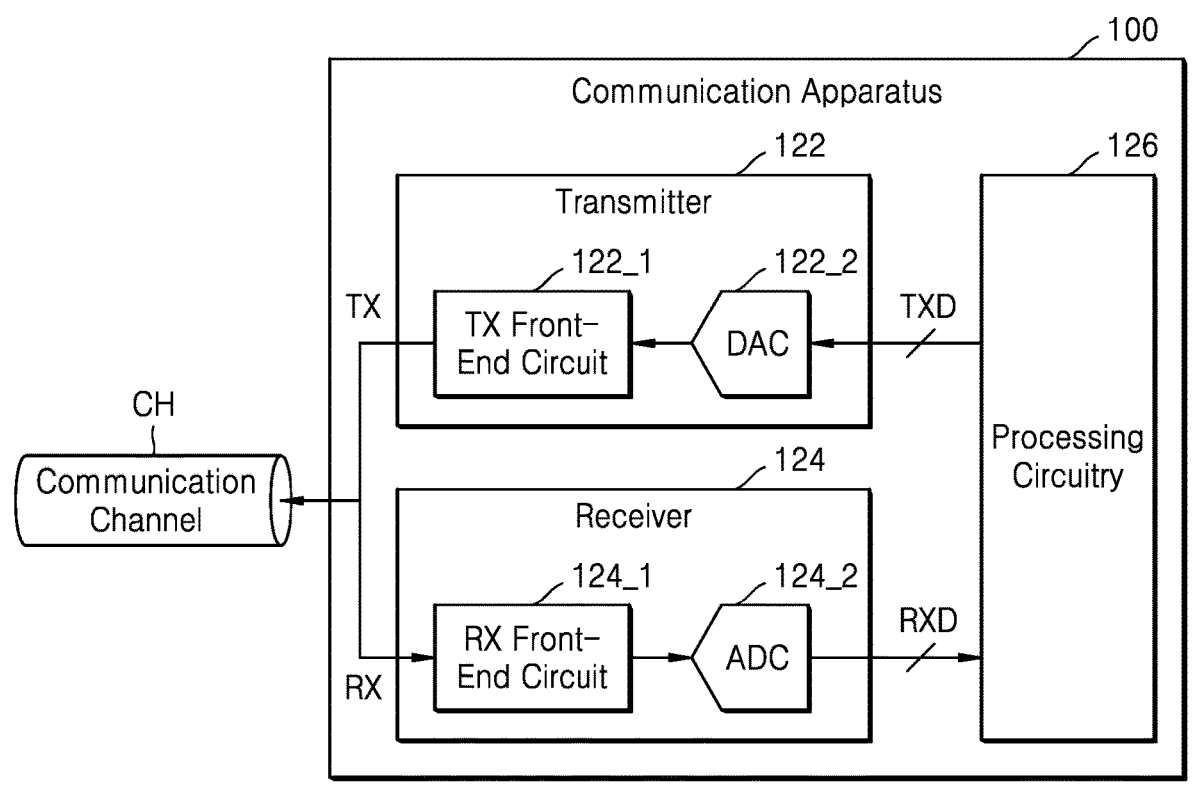
FIG. 12 is a block diagram of a communication apparatus, according to an example embodiment.

FIG. 12 is a block diagram of a communication apparatus 100, according to an example embodiment. In some embodiments, the TI-ADC 12 described above with reference to the accompanying drawings may be used for processing signals received by the communication apparatus 100.

The communication apparatus 100 may be an apparatus communicating with another communication apparatus via a communication channel CH. For example, the communication apparatus 100 may include a mobile apparatus such as a laptop computer, a mobile phone, and a wearable device, or a component included in the mobile apparatus. In addition, the communication apparatus 100 may include a stationary apparatus such as a desktop computer, a server, and a kiosk, or a component included in the stationary apparatus. In addition, the communication apparatus 100 may also be used as a component of transportation equipment such as an automobile and a ship. In some embodiments, the communication channel CH may include a wired channel, and the communication apparatus 100 may perform communication based on wired communication including, for example, optical communication, Ethernet, peripheral component interconnect (PCI), PCI express (PCIe), universal serial bus (USB), serial advanced technology attachment (ATA) (SATA), etc. In some embodiments, the communication channel CH may include wireless communication, and the communication apparatus 100 may perform communication based on wireless communication including, for example, wireless local area network (WLAN), Bluetooth, long term evolution (LTE), $5^{th}$ generation (5G), etc. As illustrated in FIG. 12, the communication apparatus 100 may include a transmitter 122, a receiver 124, and processing circuitry 126. When the communication channel CH includes a wireless channel, the communication apparatus 100 may further include at least one antenna connected to the transmitter 122 and the receiver 124. In some embodiments, the transmitter 122 and the receiver 124 may be implemented as one component, and may be comprehensively referred to as a transceiver.

The transmitter 122 may receive transmission data TXD from the processing circuitry 126, and may output the transmission signal TX to the communication channel CH based on the transmission data TXD. As illustrated in FIG. 12, the transmitter 122 may include a TX front-end circuit 122_1 and a digital-to-analog converter (DAC) 1222. The DAC 122_2 may convert the transmission data TXD received from the processing circuitry 126 into an analog signal, and the TX front-end circuit 122_1 may generate the transmission signal TX by processing the analog signal. The TX front-end circuit 122_1 may include circuits for processing the analog signals, for example, an amplifier, a filter, a mixer, etc.

The receiver 124 may receive a reception signal RX from the communication channel CH, and may provide receive data RXD to the processing circuitry 126 based on the reception signal RX. As illustrated in FIG. 12, the receiver 124 may include an RX front-end circuit 124_1 and an ADC 124_2. The RX front-end circuit 124_1 may process the reception signal RX, and may include circuits for processing the reception signal RX, for example, an amplifier, a filter, a mixer, etc.

The ADC 124_2 may generate receive data RXD by converting a signal received from the RX front-end circuit 124_1. For high speed communication, the ADC 124_2 may include the TI-ADC 12 (shown in FIG. 1) including a plurality of sub-analog-to-digital converters. Accordingly, a mismatch corrector may be used for correcting mismatches of the TI-ADC 12, and the mismatch corrector may be included at an output terminal of the ADC 124_2 in the receiver 124, or may also implemented in the processing circuitry 126. As described above with reference to the accompanying drawings, parameters used by a mismatch corrector may be determined so that the magnitude of the spurs measured in digital signals generated in response to the NRZ signal in the correction mode are decreased. Accordingly, in the ADC 1242, mismatches may be removed or reduced, and the ADC 1242 may perform high speed conversion at a high accuracy.

In some embodiments, in the correction mode, the NRZ signal provided to the ADC 124_2 may be provided by the transmitter 122. For example, the transmitter 122 and the receiver 124 may be set to the correction mode, and the transmitter 122 set to the correction mode may generate by itself the transmission signal TX corresponding to the NRZ signal. The receiver 124 may receive the NRZ signal generated by the transmitter 122 in the correction mode as the reception signal RX. The ADC 124_2 may receive the NRZ signal processed by the RX front-end circuit 124_1. By using a loop-back operation in this manner, an addition of a pattern generator for the correction mode may be omitted.

The processing circuitry 126 may generate the transmission data TXD based on information to be transmitted to another communication apparatus via the communication channel CH, and may provide the transmission data TXD to the transmitter 122. In addition, the processing circuitry 126 may receive the receive data RXD from the transmitter 122 in a receive mode, and by processing the receive data RXD, may obtain information transmitted by the other communication apparatus via the communication channel CH. In some embodiments, the processing circuitry 126 may perform at least a portion of an operation for correcting the ADC 124_2 in the correction mode. For example, the processing circuitry 126 may perform an operation of at least one of the mismatch detector 14, the parameter generator 15, and the offset detector 16 in FIG. 1. In some embodiments, the processing circuitry 126 may also perform an operation of the mismatch corrector 13 in FIG. 1. The processing circuitry 126 may include a programmable component, a component providing a fixed function, and/or a reconfigurable component.

While the inventive concept has been particularly shown and described with reference to the embodiments thereof, it will be understood that various changes in form and details may be made therein without departing from the spirit and scope of the following claims.

What is claimed is:

1. An apparatus comprising:
   a time-interleaved analog-to-digital converter configured to receive a non-return-to-zero (NRZ) signal in a correction mode and generate a first output signal, and comprising a plurality of analog-to-digital converters; and
   a mismatch corrector configured to generate a second output signal by processing the first output signal from the time-interleaved analog-to-digital converter based on parameters,
   wherein the parameters are generated based on the first output signal of the time-interleaved analog-to-digital converter in the correction mode, and
   wherein the NRZ signal is a pulse signal having a period different from a product of a sampling period of the time-interleaved analog-to-digital converter and a number of the plurality of analog-to-digital converters comprised in the time-interleaved analog-to-digital converter.

2. The apparatus of claim 1, further comprising:
   a pattern generator configured to generate the NRZ signal in the correction mode;

a mismatch detector configured to detect mismatches of the time-interleaved analog-to-digital converter based on the second output signal in the correction mode; and a parameter generator configured to generate the parameters based on the mismatches in the correction mode.

3. The apparatus of claim 2, wherein the mismatch detector comprises:

a filter configured to remove a frequency component of the NRZ signal from the first output signal and output a spur signal; and a power estimator configured to compute power of spurs based on the spur signal from the filter.

4. The apparatus of claim 3, wherein the filter comprises a notch filter configured to remove harmonics of the NRZ signal.

5. The apparatus of claim 2, wherein the parameter generator is further configured to generate the parameters based on a genetic algorithm.

6. The apparatus of claim 5, wherein the mismatches comprise a magnitude of spurs except for frequency component of the NRZ signal from the first output signal, and wherein the parameter generator is further configured to evaluate a fitness of the parameters based on the magnitude of the spurs.

7. The apparatus of claim 6, wherein, based on the magnitude of the spurs being equal to or less than a predetermined threshold, the parameter generator is further configured to terminate the genetic algorithm.

8. The apparatus of claim 1, wherein a duty cycle of the NRZ signal is less than or equal to an inverse of the number of analog-to-digital converters comprised in the time-interleaved analog-to-digital converter.

9. The apparatus of claim 1, wherein a greatest common divisor of a value obtained by dividing the period of the NRZ signal by a sampling period and the number of analog-to-digital converters comprised in the time-interleaved analog-to-digital converter is 1.

10. The apparatus of claim 1, wherein, when P and K are integers greater than 0, the mismatch corrector is further configured to process the first output signal based on K stages, each of the K stages computing a P-order equation, and wherein the parameters comprise at least one coefficient of the P-order equation.

11. The apparatus of claim 10, wherein the parameters comprise a gain, and wherein the mismatch corrector is further configured to multiply the first output signal by the gain.

12. The apparatus of claim 1, further comprising:

an offset detector configured to detect offsets of the time-interleaved analog-to-digital converter based on the first output signal in the correction mode, wherein the mismatch corrector is configured to add the detected offset to the first output signal.

13. A method of correcting mismatch of a time-interleaved analog-to-digital converter comprising a plurality of analog-to-digital converters, the method comprising:

providing a non-return-to-zero (NRZ) signal to the time-interleaved analog-to-digital converter in a correction mode;

generating parameters based on a first output signal of the time-interleaved analog-to-digital converter in the correction mode; and generating a second output signal by processing the first output signal based on the parameters, wherein the NRZ signal is a pulse signal having a period different from a product of a sampling period of the time-interleaved analog-to-digital converter and a number of the plurality of analog-to-digital converters comprised in the time-interleaved analog-to-digital converter.

14. The method of claim 13, wherein the generating the parameters comprises measuring a magnitude of spurs except for a frequency component of the NRZ signal in the first output signal.

15. The method of claim 14, wherein the generating the parameters further comprises evaluating a fitness of the parameters based on the magnitude of the spurs, according to a genetic algorithm.

16. The method of claim 13, wherein, when P and K are integers greater than 0, the generating the second output signal comprises processing the first output signal based on K stages, each of the K stages computing a P-order equation, and wherein the parameters comprise at least one coefficient of the P-order equation.

17. The method of claim 13, further comprising detecting an offset of the time-interleaved analog-to-digital converter based on the first output signal, wherein the parameters comprise a gain, and wherein the generating the second output signal comprises:

adding the offset to the first output signal; and multiplying the gain by the first output signal to which the offset has been added.

18. A method of correcting mismatch of a time-interleaved analog-to-digital converter comprising a plurality of analog-to-digital converters, the method comprising:

providing a pulse signal to the time-interleaved analog-to-digital converter in a correction mode to control the time-interleaved analog-to-digital converter to generate a first output signal;

generating parameters based on the first output signal output from the time-interleaved analog-to-digital converter; and generating a second output signal by processing the first output signal based on the parameters, wherein the generating the parameters comprises evaluating a fitness of the parameters, according to a genetic algorithm, wherein the pulse signal is a non-return-to-zero (NRZ) signal, wherein the generating the parameters further comprises measuring a magnitude of spurs except for a frequency component of the NRZ signal in the first output signal, and wherein the fitness is dependent on the magnitude of the spurs.

19. The method of claim 18, wherein, when P and K are integers greater than 0, the generating the second output signal comprises processing the first output signal based on K stages, each of the K stages computing a P-order equation, and wherein the parameters comprise at least one coefficient of the P-order equation.

* * * * *